United States Patent [19]

Oppelt

[11] 4,041,314
[45] Aug. 9, 1977

[54] DETECTOR DEVICE RESPONSIVE TO INFRARED RADIATION

[75] Inventor: Hans Oppelt, Uberlingen, Bodensee, Germany

[73] Assignee: Bodenseewerk, Geratetechnik GmbH, Uberlingen, Bodensee, Germany

[21] Appl. No.: 682,270

[22] Filed: May 3, 1976

[30] Foreign Application Priority Data

Sept. 19, 1975 Germany .............................. 2541818

[51] Int. Cl.² .............................................. G01J 1/42
[52] U.S. Cl. .................................. 250/352; 250/338
[58] Field of Search ............... 250/338, 352, 353, 203, 250/232

[56] References Cited

U.S. PATENT DOCUMENTS

| 3,082,325 | 3/1963 | Speyer | 250/352 |
| 3,173,019 | 3/1965 | Wormser | 250/232 |
| 3,323,757 | 6/1967 | Cole | 250/203 R X |
| 3,950,645 | 4/1976 | Rotstein et al. | 250/352 |

Primary Examiner—Archie R. Borchelt
Attorney, Agent, or Firm—Darbo, Robertson & Vandenburgh

[57] ABSTRACT

A concave mirror and a rotating plane mirror image an object to be detected on a reticle and screen, which reticle modulates the image. A field lens and a light piping cone projects the modulated and filtered image on an infrared detector cell. Except for the two mirrors, all of the aforesaid system is cooled by a cryostat.

2 Claims, 1 Drawing Figure

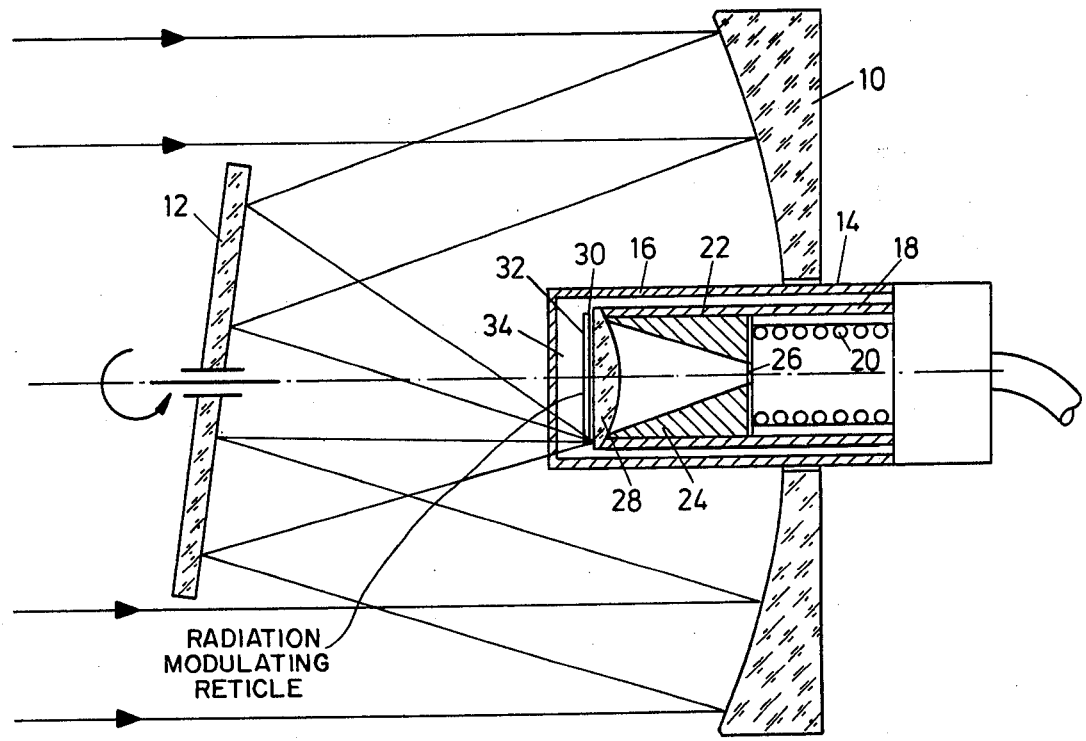

DETECTOR DEVICE RESPONSIVE TO INFRARED RADIATION

BACKGROUND AND SUMMARY OF THE INVENTION

The present invention relates to an infrared radiation detector such as, for example, might be used on a heat seeking missile. See, for example, British patent 1,355,326, published June 5, 1974 and U.S. Pat. No. 3,323,757, dated June 6, 1967. Its principal purpose is to reduce spurious radiation impinging on the detector cell.

German patent specification 1,223,585 discloses a detector device responsive to infrared radiation comprising a pot-shaped double-walled vessel the inner wall of which forms a cooling container and, together with the outer wall, defines a vacuum chamber. A detector element to be exposed to infrared radiation is located within the vaccuum chamber and in heat-conducting connection with cooling means container, said detector element being exposed to the infrared radiation in an imaging path of rays through an end of the outer wall. An opaque screen is located in the vacuum chamber, said screen enclosing the detector element and defining a radiation entrance aperture. The screen is also in heat conducting connection with the cooling means container. The purpose of the cooling means container and of the screen cooled thereby is to improve the signal-to-noise ratio of the detector by keeping this detector itself at a low temperature and to shield the detector from the radiation emitted by the elements of the apparatus containing the detector device. This prior art detector device suffers from the disadvantage that the detector is exposed to radiation not only from the imaging path of rays but also from lateral areas outside this imaging path of rays as illustrated in FIG. 1 of German patent specification 2,104,561 by hatched areas. It has been found that this radiation may also result in undesirable noise level.

German patent specification 2,109,561 discloses a detector device of this type in which the detector is to be shielded from all that radiation not emanating from the imaging path of rays. In accordance with the teaching of this German patent specification this is achieved in that optical imaging means are arranged in the radiation entrance aperture of the opaque screen, said imaging optical system being arranged to image either a field of view or (preferably) a pupil of the imaging path of rays on the detector element. In one embodiment of German patent specification 2,109,561 the imaging path of rays comprises a Cassegrain system which consists of an annular concave mirror facing towards the field of view to be observed and a plane mirror arranged to receive the radiation from the concave mirror and to image the field of view in an image plane. In the prior art device a partly transparent and partly opaque reticle is located in this image plane. The reticle may, for example, be of the type shown and described in British patent 1,355,327.

In the prior art device the reticle is located in the path of rays in front of the end face of the outer wall of the cylindrical, double-walled vessel, which outer wall encloses the vacuum chamber. The inner wall of the vessel, which wall is coaxial with respect to the outer wall and has its end face axially spaced from the end face of the outer wall, encloses the cooling means container. The detector element is attached to the end face of the inner wall. The screen forms a funnel having a reflecting internal surface, and the radiation entrance aperture of the screen or funnel is closed by a lens. The lens images the plane mirror of the Cassegrain system, which mirror defines a pupil of the imaging optical system, in the sectional circular area of the notional sphere, which extends around the apex of the cone defined by the funnel, and which passes through the borderlines of the detector elements. This prior art device, however, does not yet provide optimum signal-to-noise ratio. I have found that there is still stray radiation emanating from the utilized path of rays itself. Such stray radiation is emitted, in particular, from the reticle.

It is the object of the invention to further reduce the stray radiation in a detector device of the type previously discussed. In accordance with the invention this object is achieved in that the reticle is located in the vacuum chamber and in heat-conducting connection with the cooling means container. Thereby the reticle is cooled and the stray radiation emanating therefrom is thereby reduced. Accordingly, the image plane of the imaging path of rays has to be displaced into the vacuum chamber. Preferably the reticle is located in the radiation entrance aperture of said screen so that it is in heat-conducting connection with the cooling means container through this screen.

DESCRIPTION OF THE DRAWING

The drawing is a longitudinal sectional view of a device constructed in accordance with the invention.

DESCRIPTION OF SPECIFIC EMBODIMENT

The following disclosure is offered for public dissemination in return for the grant of a patent. Although it is detailed to ensure adequacy and aid understanding, this is not intended to prejudice that purpose of a patent which is to cover each new inventive concept therein no matter how others may later disguise it by variations in form or additions or further improvements.

The imaging path of rays comprises a Cassegrain system having an annular concave mirror 10 and a rotating plane mirror 12 inclined with respect to the axis of rotation and of mirror 10. Due to the rotation of the plane mirror 12, the image of an object detected by this system carries out a rotatory movement in the image plane. The detector device comprises a double-walled vessel 14 having a cylindrical outer wall 16 and a cylindrical inner wall 18. Within and in heat conducting contact with the inner wall is a cryostat 20 by which the cooling is effected. The cooled screen comprises an extension 22 of the inner wall 18 which encloses a light-piping cone 24 having a reflecting tapering inner surface. An infared detector cell 26 is located at the bottom of the light-piping cone 24. The radiation entrance aperture of the light-piping cone 24 is closed by a planoconvex lens 28, the convex surface of which faces the detector cell 26. Obviously, the only entrance for radiation from the outside is through the lens. The plane surface of the planoconvex lens 28 is located substantially in the image plane of the imaging optical system 10, 12. A screen or filter 30 and a reticle 32 are placed, one on top of the other, on this plane surface of the planoconvex lens 28. A vacuum chamber 34 is defined between the inner wall 18 and the outer wall 16 of the vessel 14.

By the rotatory movement of an image produced by the imaging optical system in the image plane, the radiation from this image will be modulated by the reticle.

Thereby the detector cell 26 produces A. C. signals from which the deviation of the object for the axis of the system can be derived in well-known manner. The planoconvex lens 28, which acts as a field lens, together with the light-piping cone serves to image the pupil as defined by the plane mirror 12 on the detector element 26, so that no radiation, which does not emanate from the utilized path of rays, is allowed to fall on the detector cell 26. In the device described, the reticle 32 is also cooled by cryostrat 20 since it is in a heat conducting contact path comprising the screen 30, the lens 28, the inner wall 22 and the cryostat 20. Due to the cooling the reticle gives rise only to a low-level stray radiation from the utilized path of rays. The reflecting elements 10 and 12, because of their reflecting surface, emit only a low radiation of their own. Thus the construction of the invention permits a substantial further improvement of the detector device.

I claim:

1. In a detector device responsive to infrared radiation and including a double-walled vessel having an inner wall which forms a cooling means container and an outer wall, the two walls defining a vacuum chamber; a detector element to be exposed to the infrared radiation located within said vacuum chamber in heat-conducting connection with the cooling means container, said detector element being exposed to the infrared radiation in an imaging path of rays through the end of the outer wall; an opaque screen located in the vacuum chamber, said screen enclosing the detector element and defining a radiation entrance aperture and being also in heat-conducting connection with the cooling means container; optical imaging means arranged in the radiation entrance aperture of the opaque screen; and a radiation modulating reticle located in the image plane and being partly transparent and partly opaque, the improvement comprising:

the reticle being located in the vacuum chamber and in heat-conducting connection with the cooling means container.

2. In a detector device as set forth in claim 1, wherein the reticle is located in said radiation entrance aperture of said screen and in contact with the screen.

* * * * *